United States Patent [19]

Archer et al.

[11] Patent Number: 5,386,160

[45] Date of Patent: Jan. 31, 1995

[54] TRIM CORRECTION CIRCUIT WITH TEMPERATURE COEFFICIENT COMPENSATION

[75] Inventors: Donald M. Archer, Sunnyvale; Jung S. Hoei, San Jose, both of Calif.

[73] Assignee: National Semiconductor Corporation, Santa Clara, Calif.

[21] Appl. No.: 42,130

[22] Filed: Apr. 2, 1993

Related U.S. Application Data

[63] Continuation-in-part of Ser. No. 794,960, Nov. 20, 1991, Pat. No. 5,200,654.

[51] Int. Cl.$^6$ ............................................. H03F 1/30
[52] U.S. Cl. ..................... 327/513; 330/289; 327/362; 327/307
[58] Field of Search ............ 307/491, 310, 296.1, 307/296.6, 291, 494, 296.4, 296.5; 330/288, 289, 257, 256; 323/315

[56] References Cited

U.S. PATENT DOCUMENTS

| | | | |
|---|---|---|---|
| 3,703,650 | 11/1972 | Kendall | 307/310 |
| 4,050,030 | 9/1977 | Russell | 330/23 |
| 4,464,588 | 8/1984 | Wieser | 307/491 |
| 4,598,215 | 7/1986 | Schechtman et al. | 307/491 |
| 4,618,833 | 10/1986 | Russell | 330/256 |
| 4,656,436 | 4/1987 | Saari | 330/253 |
| 4,853,647 | 8/1989 | Low et al. | 330/256 |
| 4,879,524 | 11/1989 | Bell | 330/288 |
| 5,061,862 | 10/1991 | Tamagawa | 307/296.1 |
| 5,126,590 | 6/1992 | Chern | 307/296.1 |

FOREIGN PATENT DOCUMENTS 0140677  5/1985  European Pat. Off. .

OTHER PUBLICATIONS

J. Haspeslagh and W. Sansen, "Design Techniques for Fully Differential Amplifiers", IEEE 1988 Custom Integrated Circuits Conference, May 16, 1988, pp. 1221-1224.

*Primary Examiner*—Timothy P. Callahan
*Assistant Examiner*—My-Trang Nu Ton
*Attorney, Agent, or Firm*—Limbach & Limbach

[57] ABSTRACT

An operational amplifier bias system provides input offset voltage trim current with minimum offset thermal drift. The bias system includes a bias generator that provides bias current to the op amp. Correction circuitry responsive to the bias current provides an input offset trim current that compensates for offset drift error with change in temperature. The correction circuitry includes a resistive element, an input current mirror responsive to the bias current for providing a reference current to the resistive element to provide a temperature coefficient conversion current having a predetermined temperature coefficient, and a voltage reference that sets the resistance of the resistive element.

7 Claims, 4 Drawing Sheets

TRIM CORRECTION CIRCUIT WITH TEMPERATURE COEFFICIENT COMPENSATION

RELATED APPLICATIONS

The present application is a continuation-in-part of prior commonly-assigned application Ser. No. 07/794,960 filed Nov. 20, 1991 now U.S. Pat. No. 5,200,654.

BACKGROUND OF THE INVENTION

1. Field of the Invention

The present invention relates to operational amplifiers and, in particular, to a precision trimming circuit that provides trim current compensation with the necessary temperature coefficient to track changes in input offset voltage with variations in temperature.

2. Discussion of the Prior Art

An operational amplifier (op amp), a basic building block in analog integrated circuits, amplifies the difference between two different potentials. A basic op amp consists of a dc amplifier with a differential input and a single-ended output.

An ideal op amp has zero output voltage for zero input. In reality, however, because of the inherent lack of precision in matching the op amp's two differential input transistors, an op amp will always have some output voltage for no input. This voltage is called "input offset voltage."

The magnitude of the input offset voltage can cause yield problems and can severely limit the applications in which the op amp can be used.

Input offset is not a serious problem in and of itself, since it can be cancelled by equal and opposite compensating signals. The problem with input offset is that it can change with temperature. This change in input offset voltage with temperature is called thermal drift. Thus, to maintain the performance of the op amp within specified criteria, the offset compensation mechanism must be correlated to thermal drift; that is, it must provide an offset cancellation signal that tracks the change in input offset voltage with variations in temperature.

The requirement for input offset compensation in bipolar op amp circuits is not so severe because it is possible to fabricate matching pairs of bipolar transistors with a relatively high level of precision. However, because of the well-known power consumption and speed benefits afforded by complementary metal-oxide semiconductor (CMOS) integrated circuits, this technology is becoming increasingly more popular for use in fabricating all types of circuits, including op amps. While CMOS op amps have relatively low input offset when operated in the sub-threshold region, input offset in these circuits when operated in or near the sub-threshold (weak inversion) or quasi sub-threshold (moderate inversion) region is dominated by the initial threshold voltage ($V_T$).

The conventional technique for compensating for input offset and thermal drift in op amps is to provide a resistive nulling network that modifies the current relationships for the input differential pair.

FIG. 1 shows an op amp circuit in which the input stage is a differential PMOS pair that works into a bipolar load. Compensation for input offset voltage is provided by null resistors that provide an offset current to the differential pair for improved offset matching. That is, a correction voltage is reflected into the source leads of the input differential pair to balance the differential pair current densities.

The problem with this approach is that, as temperature changes, the trim input offset compensation current does not track the offset. That is, as temperature varies, the trim current and the offset error change at different rates.

When the op amp is operated in the sub-threshold region, the unbalanced currents magnify the offset error. That is, while the offset adjustment corrects for unbalanced differential pair currents, it doesn't correct for threshold voltage differences in the input FETs. Therefore, input offset voltage changes with changes in temperature.

Butler and Lane, "An Improved Performance MOS/Bipolar Op-Amp", 1974 IEEE International Solid State Circuits Conference, p. 138, describe an operational amplifier circuit, shown in FIG. 2, that also utilizes trimming current injection to compensate for input offset voltage. In this circuit, the correction voltage is derived from the IR drop in a series string of diffused resistors in which the temperature coefficient of the current is arranged to approximate the negative of the resistor temperature coefficient. Fine nulling is accomplished utilizing resistors $R_9$ and $R_{10}$, which are suitably tapped to minimize the effect of the diffused resister and trimpot temperature coefficients. However, this approach suffers from the same problems as the FIG. 1 offset compensation scheme in that the trim current does not track changes in the offset voltage with changes in temperature.

Thus, it would be highly desirable to have available a compensation circuit that can provide null input offset, but is not susceptible to thermal drift.

FIG. 3 shows a circuit described by Allen and Holberg, *CMOS Analog Circuit Design*, p. 248, for obtaining a negative temperature coefficient. The FIG. 3 threshold reference circuit balances threshold reference device Q1 against resistor R to provide a supply-independent reference current utilizable for setting up the bias of an op amp. However, this circuit has a strong negative temperature dependence.

SUMMARY OF THE INVENTION

The present invention provides an op amp bias system that provides input offset voltage trim current with minimum offset thermal drift. The bias system includes a bias generator that provides bias current to the op amp. Correction circuitry responsive to the bias current provides an input offset trim current that compensates for offset drift error with change in temperature.

In accordance with the invention, the correction circuitry includes a resistive element, an input current mirror responsive to the bias current for providing a reference current to the resistive element to provide a temperature coefficient conversion current having a predetermined temperature coefficient, and a voltage reference that sets the resistance of the resistive element.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
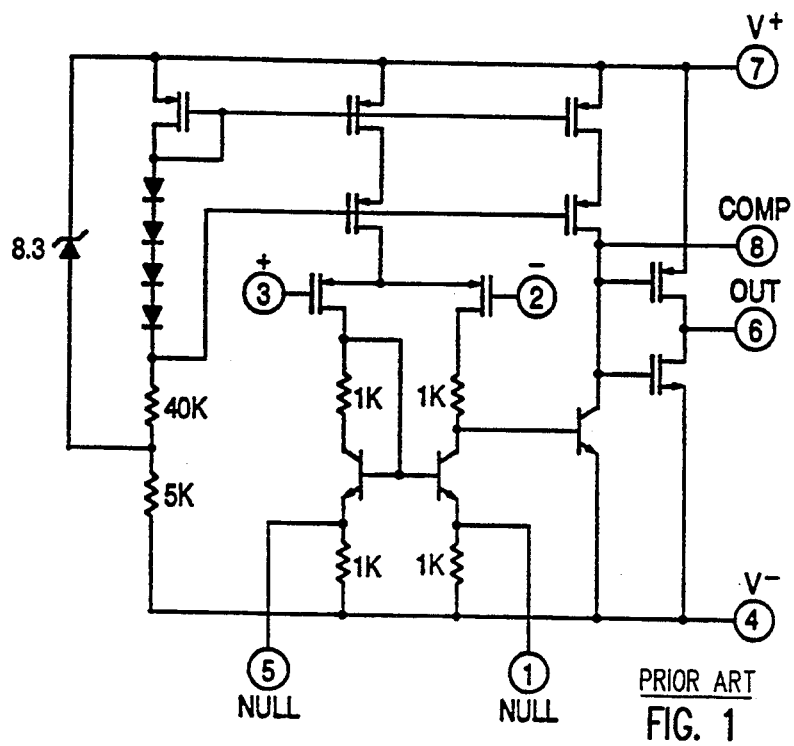
FIG. 1 is a schematic diagram illustrating a conventional trim current adjustment technique for compensating for input offset voltage in an operational amplifier.
Figure 2:
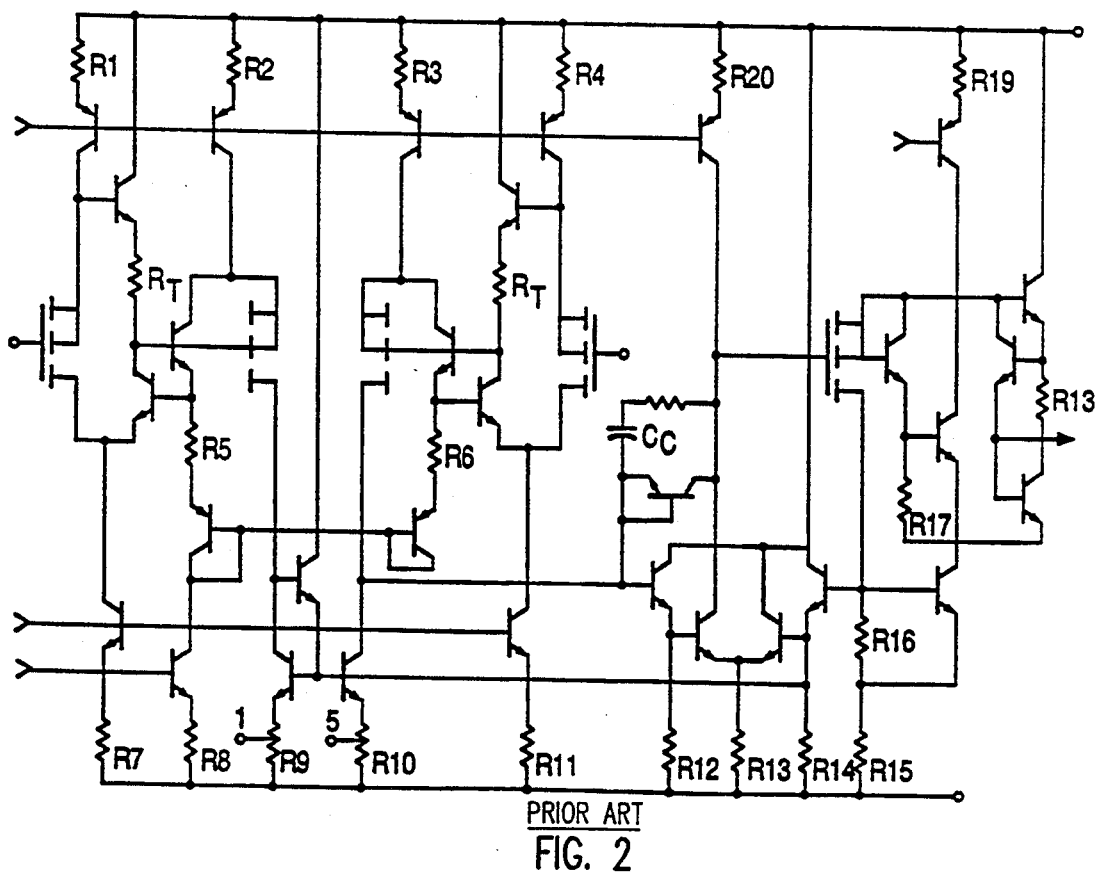
FIG. 2 is a schematic diagram illustrating another conventional technique for providing trim current to compensate for input offset voltage.
Figure 3:
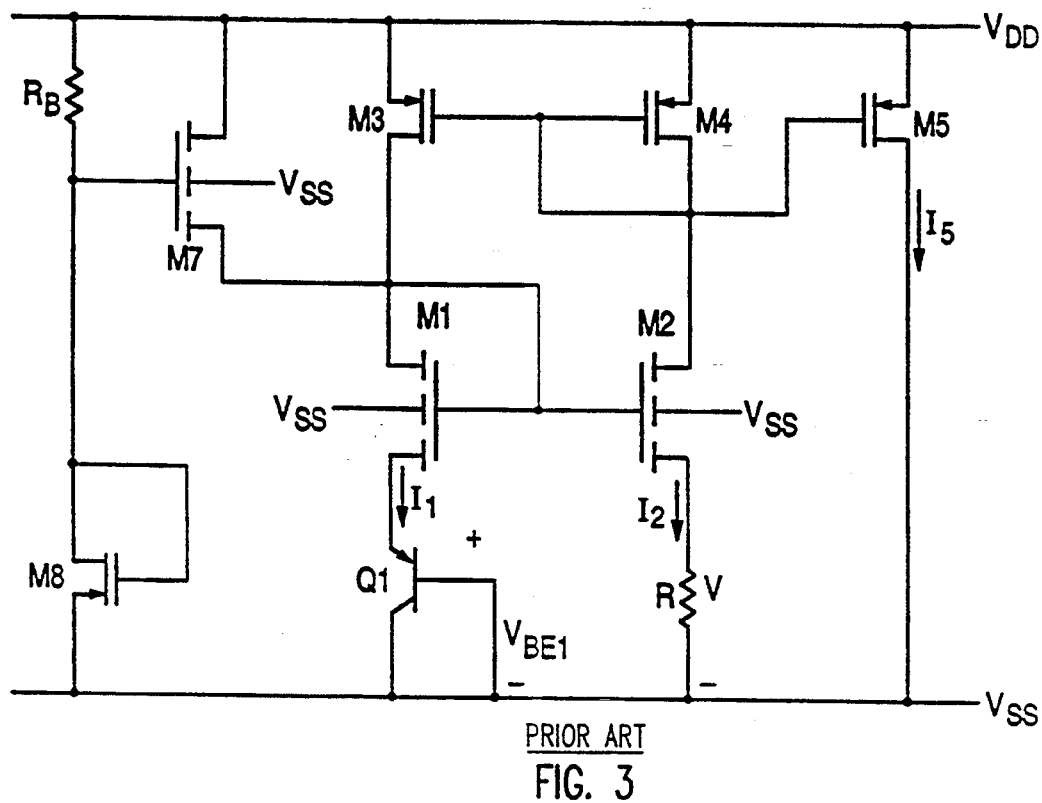
FIG. 3 is a schematic diagram illustrating a circuit for generating a bias current for an op amp that has a strong negative temperature coefficient.
Figure 4:
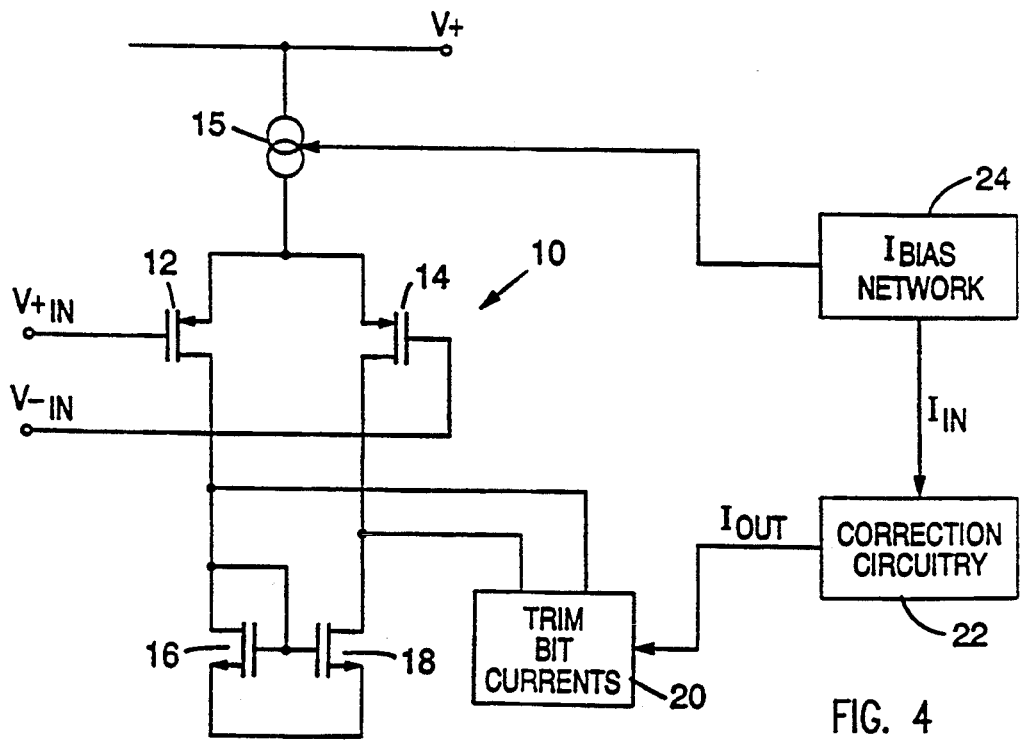
FIG. 4 is a block diagram illustrating an operational amplifier system that includes correction circuitry for compensating for input offset voltage in accordance with the present invention.

FIG. 4 shows an operational amplifier 10 that includes a p-channel input differential pair 12 and 14 for receiving differential input signals $V+_{in}$ and $V-_{in}$, respectively. Op amp 10 also includes a current mirror comprising n-channel transistors 16 and 18 connected in the conventional manner. A current source 15 is connected between the commonly-connected source electrodes of the differential pair 12, 14 and the positive supply V+.

Trim current bits 20, which may be of conventional current mirror design, are connected to inject trim current to null the input offset voltage of the input differential pair 12, 14.

In accordance with the present invention, temperature coefficient correction circuitry 22 provides trim compensation current with the necessary temperature coefficient to track input offset voltage with changes in temperature.

Trim current correction circuitry 22 and current source 15 are driven by a conventional current bias network 24, which can have a positive temperature coefficient.

Figure 5:
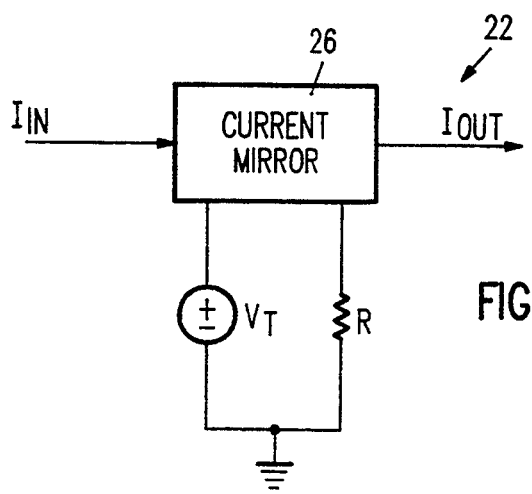
FIG. 5 is a block diagram illustrating a circuit for providing temperature compensated trimming current in accordance with the present invention.

FIG. 5 shows a functional block diagram of temperature coefficient correction circuitry 22 in accordance with the present invention. Current mirror 26 provides an output current proportional to voltage reference $V_T$. This output current is mirrored by current mirror 26 to active resistor R. Active resistor R is controlled by voltage reference $V_T$. Thus, current mirror 26 provides the temperature compensated output current Iout to the trim bit currents 20 (see FIG. 4).

Figure 6:
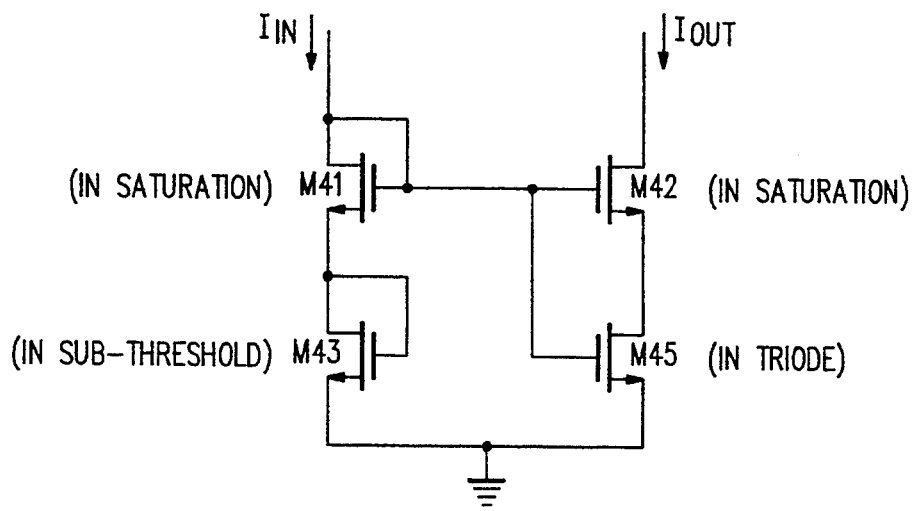
FIG. 6 is a schematic diagram illustrating an embodiment of a circuit that provides temperature compensated trimming current in accordance with the present invention.

FIG. 6 shows an n-channel "balanced" embodiment of compensation circuitry 22 for providing temperature compensated trimming current to a CMOS operational amplifier to compensate for input offset voltage. The FIG. 6 circuit provides trim current with the necessary temperature coefficient to track input offset voltage thermal drift when driven by a current that has a more positive temperature coefficient than output current Iout.

The FIG. 6 circuit comprises a conventional current mirror that includes N-channel mirror transistors M41 and M42. An N-channel diode-connected threshold voltage reference transistor M43, which is operable in the sub-threshold range, is connected between the source of mirror transistor M41 and the negative power supply (ground). N-channel transistor M45, which operates in the triode mode, is connected between mirror transistor M42 and the negative supply. Thus, transistor M45 operates as an active resistor.

Threshold voltage reference transistor M43 is constructed to have an area such that it operates in the sub-threshold region, thus providing a reference voltage, with negative temperature coefficient, for N-channel mirror transistor M41. As stated above, transistor M45 operates in the triode region. Thus, if an appropriate voltage with the necessary temperature coefficient is applied to the gate of transistor M45, it serves as an excellent temperature independent resistor.

The input current Iin is reflected through current mirror M41, M42. That is, the drain current Iin equals the drain current of mirror transistor M42 at nominal reference temperature (+25° C.). This provides a strong negative temperature coefficient.

The above-described mechanism relies on compensated voltage applied to the gate of the triode-operated transistor M45, the resistance of transistor M45 being proportional to its transconductance. Knowing the voltage across transistor M45, the size of the transistor M45 can be calculated for a given current requirement.

Figure 7:
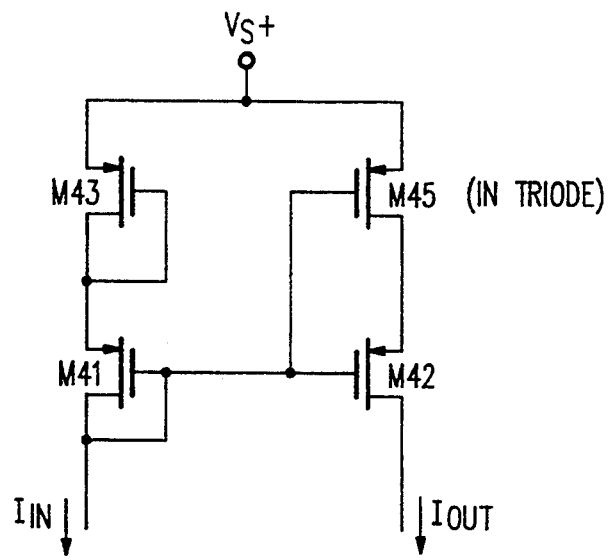
FIG. 7 is a schematic diagram illustrating a p-channel equivalent of the FIG. 5 n-channel embodiment of the invention.

FIG. 7 shows a P-channel equivalent to the FIG. 6 N-channel circuit. The operation of the FIG. 7 P-channel equivalent circuit will be clear to those skilled in the art based on the above-provided discussion regarding FIG. 6.

Figure 8:
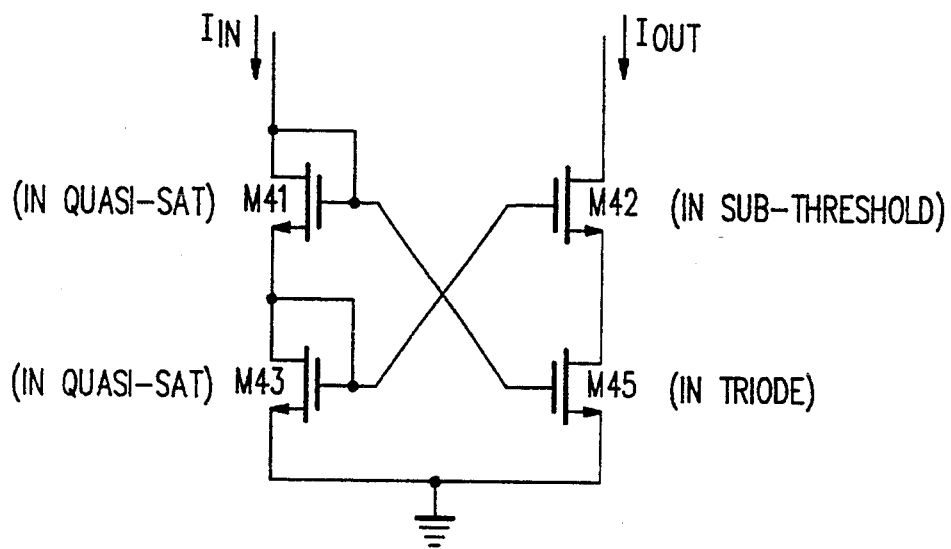
FIG. 8 is a schematic diagram illustrating an alternative embodiment of a circuit that provides temperature compensated trimming current in accordance with the present invention.

FIG. 8 shows an N-channel "imbalanced" alternative embodiment of trim current correction circuitry 22 in accordance with the present invention.

As will be recognized by those skilled in the art, the FIG. 8 circuit will provide a more linear response than will the FIG. 6 circuit if transistor M45 is operated in as an active resistor in the triode mode and mirror transistor M42 is operated in the sub-threshold mode while mirror transistor M41 and voltage reference transistor M43 are operating in quasi-saturation.

Figure 9:
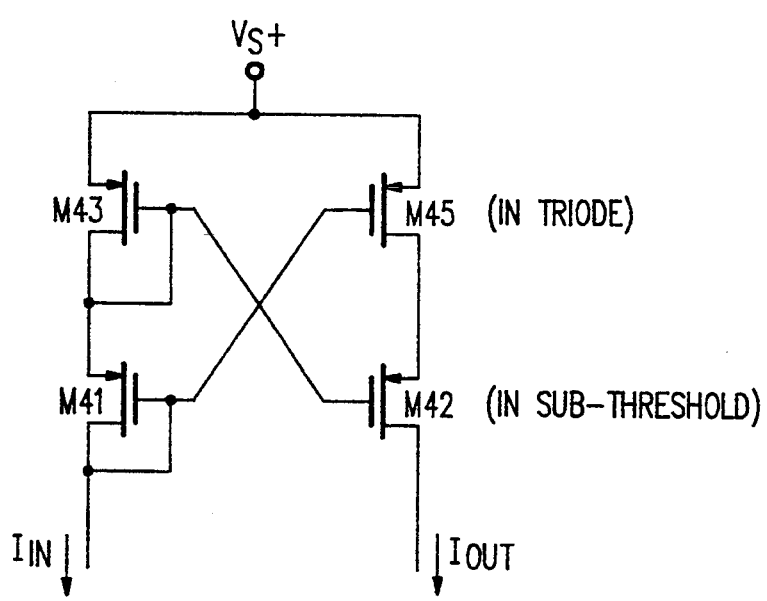
FIG. 9 is a schematic diagram illustrating a p-channel equivalent of the FIG. 7 n-channel alternative embodiment of the invention.

FIG. 9 shows a P-channel equivalent to the FIG. 8 N-channel circuit. The operation of the FIG. 9 P-channel equivalent circuit will be clear to those skilled in the art based on the above-provided discussion regarding FIG. 8.

It should be understood that various alternatives to the embodiments of the invention described herein may be employed in practicing the invention. It is intended that the following claims define the scope of the invention and that methods and circuits within the scope of these claims and their equivalents be covered thereby.

We claim:

1. An operational amplifier bias system that provides input offset voltage trim current to an operational amplifier with minimum offset thermal drift, the bias system comprising:

a bias generator that provides bias generator current to the operational amplifier; and correction circuitry connected to receive the bias generator current and to provide an input offset trim current to the operation amplifier that compensates for offset drift error of the input offset voltage of the operational amplifier with change in temperature, the correction circuitry including a resistive element, an input current mirror connected to receive the bias generator current and to provide a reference current to the resistive element, the resistive element responding to the reference current by providing a temperature coefficient conversion current having a predetermined temperature coefficient, and voltage reference circuitry connected to provide a voltage reference signal that sets the resistance of the resistive element.

2. An operation amplifier bias system as in claim 1 wherein the resistive element comprises a linear resistive element.

3. An operational amplifier bias system as in claim 1 wherein the resistive element comprises an active resistor.

4. An operational amplifier bias systems as in claim 3 wherein the active resistor comprises a MOSFET device biased for operation in the triode region.

5. A method of providing input offset voltage trim current to an operational amplifier, the method comprising:

providing a bias current to the operational amplifier;

utilizing the bias current to reflect a reference voltage to a resistive element to provide a temperature coefficient conversion current having a predetermined temperature coefficient; and utilizing the temperature coefficient conversion current to generate the input offset voltage trim current.

6. An operational amplifier bias circuit for providing temperature compensated trim current to a CMOS operational amplifier to compensate for input offset voltage, the circuit comprising:

a first current mirror that includes a first diode-connected N-channel mirror transistor and a second N-channel mirror transistor, the gate of the first mirror transistor being connected to the gate of the second mirror transistor;

a diode-connected N-channel threshold voltage reference transistor operable in the subthreshold range and having its drain connected to the source of the first mirror transistor and its source connected to a negative supply; and an N-channel resistive transistor, operable in the triode mode, and having its drain connected to the source of the second mirror transistor, its source connected to the negative supply, and its gate connected to the commonly connected gates of the first and second mirror transistors.

7. An operational amplifier bias circuit for providing temperature compensated trim current to a CMOS operational amplifier to compensate for input offset voltage, the circuit comprising a first current mirror that includes a first diode-connected N-channel mirror transistor and a second N-channel mirror transistor, the second mirror transistor being operable in the subthreshold range;

a diode-connected N-channel threshold voltage reference transistor having its drain connected to the source of the first mirror transistor, its source connected to a negative supply, and its gate connected to the gate of the second mirror transistor; and an N-channel resistive transistor, operable in the triode mode, and having its drain connected to the source of the second mirror transistor, its source connected to the negative supply, and its gate connected to the gate of the first mirror transistor.

* * * * *